(12) United States Patent
Nakamura et al.

(10) Patent No.: US 7,656,693 B2
(45) Date of Patent: Feb. 2, 2010

(54) SEMICONDUCTOR DEVICE AND MANUFACTURING METHOD THEREOF

(75) Inventors: Yoshitaka Nakamura, Tokyo (JP); Mitsutaka Izawa, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 76 days.

(21) Appl. No.: 12/047,537

(22) Filed: Mar. 13, 2008

(65) Prior Publication Data

US 2008/0239815 A1 Oct. 2, 2008

(30) Foreign Application Priority Data

Mar. 30, 2007 (JP) .............................. 2007-090099

(51) Int. Cl.
 *G11C 5/06* (2006.01)
(52) U.S. Cl. .................... 365/63; 365/149; 365/185.13; 257/301; 257/306; 438/241; 438/243
(58) Field of Classification Search .................. 365/63, 365/149, 185.13, 214; 257/301, 303, 306, 257/390; 438/238, 241, 243
See application file for complete search history.

(56) References Cited

U.S. PATENT DOCUMENTS

| | | | |
|---|---|---|---|
| 6,359,301 B1* | 3/2002 | Kuroda | 257/306 |
| 6,944,080 B2* | 9/2005 | Sekiguchi et al. | 365/214 |
| 2002/0195641 A1* | 12/2002 | Fukuda et al. | 257/306 |
| 2005/0180232 A1* | 8/2005 | Arao | 365/202 |

FOREIGN PATENT DOCUMENTS

| | | |
|---|---|---|
| JP | 7-142597 A | 6/1995 |
| JP | 9-275193 A | 10/1997 |
| JP | 2000-58771 A | 2/2000 |
| JP | 2002-319632 A | 10/2002 |

* cited by examiner

*Primary Examiner*—Pho M Luu
*Assistant Examiner*—Toan Le
(74) *Attorney, Agent, or Firm*—Sughrue Mion, PLLC

(57) ABSTRACT

In a memory cell area of a semiconductor device, first, second, and third inter-layer insulating films respectively cover a cell transistor, a bit wiring line, and a capacitor which are connected to each other. In an adjacent peripheral circuit area, a peripheral-circuit transistor is covered with the first inter-layer insulating film, a first-layer wiring line connected to the peripheral-circuit transistor is provided on the first inter-layer insulating film and covered with the second inter-layer insulating film, and a second-layer wiring line is provided on the third inter-layer insulating film. In the memory cell area, a landing pad is provided on the second inter-layer insulating film and between the capacitor and a contact plug for connecting the capacitor to the cell transistor. An assist wiring line connected to the first-layer wiring line is provided on the main surface of the second inter-layer insulating film, on which the landing pad is provided.

7 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device including memory cells and a peripheral circuit and/or a logic circuit of a DRAM (dynamic random access memory), and a manufacturing method of the semiconductor device.

Priority is claimed on Japanese Patent Application No. 2007-090099, filed Mar. 30, 2007, the contents of which are incorporated herein by reference.

2. Description of the Related Art

Conventional semiconductor devices include general DRAMs, embedded DRAMs, and the like. In a peripheral circuit area of a general DRAM or a logic circuit area of an embedded DRAM, in order to make transistors conductive to each other, (i) first-layer wiring lines formed on the same layer as that on which a bit wiring line of a memory cell is provided below a capacitor, and (ii) second-layer wiring lines and third-layer wiring lines, which are provided above the capacitor, are electrically connected so as to form a circuit.

FIG. 16 is a general sectional view of a semiconductor device, which the inventors of the present invention have developed and studied. In the semiconductor device, a memory cell area 100 and a peripheral circuit area 101 of a DRAM cell are formed on a single semiconductor substrate 102. In the following explanations of the present specification, a peripheral circuit area of a general DRAM and a logic circuit area of an embedded DRAM are each generally called a "peripheral circuit area".

In the memory cell area 100 of the above-described semiconductor device, diffusion layer areas 105, 106, and 107 are formed side by side, in an area interposed between element-separating insulating films 103. Between the diffusion layer areas 105 and 106, and also between the diffusion layer areas 106 and 107, a gate insulating film 108 is individually formed on the semiconductor substrate 102, and a gate electrode 109 is formed on each gate insulating film 108. Each gate electrode 109 is covered with a side-wall insulating film 110 and a separating insulating film 111, so that each gate electrode 109 is isolated in an insulated manner. These elements are covered with a first inter-layer insulating film 112, and first contact plugs 113 pass through the first inter-layer insulating film 112 in the vertical direction, so that they are individually connected to the diffusion layer areas 105, 106, and 107. A second inter-layer insulating film 115 is formed on the first inter-layer insulating film 112, and second contact plugs 116 pass through the second inter-layer insulating film in the vertical direction, so that they are individually connected to the first contact plugs 113 which are connected to the diffusion layer areas 105 and 107. In addition, a bit wiring line 117 is connected to the first contact plug 113 which is connected to (i) the diffusion layer area 106 and (ii) a part of the first inter-layer insulating film 112, from thereabove.

A third inter-layer insulating film 120 is further stacked on the second inter-layer insulating film 115, and a capacitor structure 121 is provided in the third inter-layer insulating film 120 so that it is arranged on the second contact plugs 116. The capacitor structure 121 includes lower electrodes 122, a capacitance insulating film 123, and an upper electrode 125, and is electrically connected to the second contact plugs 116 via landing pads 126, which are provided on the bottom side of the lower electrodes 122.

On the other hand, in the peripheral circuit area 101 (or a logic circuit area of an embedded DRAM), diffusion layer areas 130 and 131 are formed side by side, in an area interposed between the element-separating insulating films 103. Between the diffusion layer areas 130 and 131, a gate insulating film 132 is formed on the semiconductor substrate 102, and a gate electrode 133 is formed on the gate insulating film 132. The gate electrode 133 is covered with a side-wall insulating film 135 and a separating insulating film 136, so that the gate electrode 133 is isolated in an insulated manner. These elements are covered with the first inter-layer insulating film 112, and third contact plugs 137 pass through the first inter-layer insulating film 112 in the vertical direction, so that they are individually connected to the diffusion layer areas 130 and 131. In addition, fourth contact plugs 138A and 138B are formed in a manner such that they pass through the second inter-layer insulating film 115 and the third inter-layer insulating film 120 which are stacked on the first inter-layer insulating film 112. The fourth contact plugs 138A and 138B are respectively connected via first-layer wiring lines 139A and 139B to the third contact plugs 137, which are connected to the diffusion layer areas 130 and 131. The fourth contact plugs 138A and 138B are also connected to second wiring lines 140 which are formed on the third inter-layer insulating film 120.

In the above-described semiconductor device, the diffusion layer areas 130 and 131 each function as the source or drain area of a transistor in the peripheral circuit area 101, and the second wiring lines 140 are provided on the third inter-layer insulating film 120 which is positioned above the diffusion layer areas 130 and 131. The connection between the diffusion layer areas 130 and 131 and the second wiring lines 140 are established by means of the contact plugs 138A and 138B, which are made of metal, and formed via the first-layer wiring lines 139A and 139B in a manner such that the contact plugs 138A and 138B are embedded in the contact holes formed through the relevant inter-layer insulating films.

In a known example of such a semiconductor device which includes (i) transistor and capacitor structures in a memory cell area and (ii) transistor and wiring structures in a peripheral circuit area, and has a multilayered structure, first and second inter-layer insulating films are stacked on a semiconductor substrate, where plug electrodes pass through the inter-layer insulating films, and an aluminium wiring layer is provided via a pad layer on each plug electrode (see Japanese Unexamined Patent Application, First Publication No. H07-142597).

In another known example of such a semiconductor device, when forming a layered structure of the lower electrode of a capacitor, a power supply layer is provided at the same layer position as that of the layer of the lower electrode (see Japanese Unexamined Patent Application, First Publication No. H09-275193).

In another known example, either of the upper electrode, a dielectric film, and the lower electrode, which form a capacitor of a cell array, can be used as a local wiring line in a peripheral circuit area (see Japanese Unexamined Patent Application, First Publication No. 2000-58771).

In addition, Japanese Unexamined Patent Application, First Publication No. 2002-319632 discloses a storage node pad in a logic circuit area, which is formed through the same process as that for forming the lower electrode of a capacitor in a DRAM part (see Japanese Unexamined Patent Application, First Publication No. 2002-319632).

In a highly-integrated semiconductor device, the first-layer wiring lines 139A and 139B have a fine structure so as to provide a large number of conductive terminals with respect to the relevant transistors. Therefore, if the integration of the semiconductor device further proceeds and the layout size (i.e., F value) is decreased, fine processing of the first-layer wiring lines 139A and 139B becomes more difficult. With respect to the peripheral circuit area of a general DRAM or the logic circuit area of an embedded DRAM, wiring lines are closely arranged especially in a boundary area which is formed over the memory cell area 100 and the peripheral circuit area 101. Therefore, in such an area, finer processing of the first-layer wiring lines 139A and 139B is difficult. Additionally, accompanied with a further decrease in the wiring width, an RC delay appears. Accordingly, it is required to form the peripheral circuit or the logic circuit without further fining the first-layer wiring lines 139A and 139B.

SUMMARY OF THE INVENTION

In light of the above circumstances, an object of the present invention is to provide (i) a semiconductor device, which can be manufactured without increasing the number of manufacturing processes, and contributes to the reduction of the wiring density of first-layer wiring lines, improved flexibility in the circuit layout, and the reduction of parasitic resistance or parasitic capacitance of the first-layer wiring lines, and (ii) a manufacturing method thereof.

Therefore, the present invention provides a semiconductor device having a memory cell area for storing data and a peripheral circuit area adjacent thereto on a semiconductor substrate, wherein:

in the memory cell area, a cell transistor, a bit wiring line connected to the cell transistor, and a capacitor also connected to the cell transistor are provided in a vertically-layered structure;

a first inter-layer insulating film is provided so as to cover the cell transistor;

a second inter-layer insulating film is provided so as to cover the bit wiring line which is provided in an upper layer with respect to that of the cell transistor;

a third inter-layer insulating film is provided so as to cover the capacitor which is provided in an upper layer with respect to that of the bit wiring line;

in the peripheral circuit area, a peripheral-circuit transistor is provided and is covered with the first inter-layer insulating film;

a first-layer wiring line connected to the peripheral-circuit transistor is provided on a main surface of the first inter-layer insulating film;

the first-layer wiring line is covered with the second inter-layer insulating film;

a second-layer wiring line is provided on a main surface of the third inter-layer insulating film which is formed on the second inter-layer insulating film;

in the memory cell area, a landing pad is provided on a main surface of the second inter-layer insulating film and at a connection part between the capacitor and a contact plug which is formed for connecting the capacitor to the cell transistor provided in a lower layer; and an assist wiring line connected to the first-layer wiring line is provided on the main surface of the second inter-layer insulating film, on which the landing pad is provided.

Typically, the assist wiring line is connected to both the first-layer wiring line and the second-layer wiring line.

In a preferable example:

the capacitor has a stacked structure including a lower electrode, a capacitance insulating film, and an upper electrode; and the landing pad is provided between the lower electrode and the contact plug.

Typically, the assist wiring line provided on the main surface of the second inter-layer insulating film is arranged to extend on both the memory cell area and the peripheral circuit area on the semiconductor substrate.

Preferably, the assist wiring line provided on the main surface of the second inter-layer insulating film is electrically connected to the first-layer wiring line which is formed on the main surface of the first inter-layer insulating film and is positioned above a separating insulating film by which the memory cell area and the peripheral circuit area are separated from each other on the semiconductor substrate.

The present invention also provides a method of manufacturing a semiconductor device having a memory cell area for storing data and a peripheral circuit area adjacent thereto on a semiconductor substrate, wherein:

in the memory cell area, a cell transistor, a bit wiring line connected to the cell transistor, and a capacitor also connected to the cell transistor are provided in a vertically-layered structure;

a first inter-layer insulating film is provided so as to cover the cell transistor;

a second inter-layer insulating film is provided so as to cover the bit wiring line which is provided in an upper layer with respect to that of the cell transistor;

a third inter-layer insulating film is provided so as to cover the capacitor which is provided in an upper layer with respect to that of the bit wiring line;

in the peripheral circuit area, a peripheral-circuit transistor is provided and is covered with the first inter-layer insulating film;

a first-layer wiring line connected to the peripheral-circuit transistor is provided on a main surface of the first inter-layer insulating film;

the first-layer wiring line is covered with the second inter-layer insulating film;

a second-layer wiring line is provided on a main surface of the third inter-layer insulating film which is formed on the second inter-layer insulating film;

in the memory cell area, a landing pad is provided on a main surface of the second inter-layer insulating film and at a connection part between the capacitor and a contact plug which is formed for connecting the capacitor to the cell transistor provided in a lower layer;

an assist wiring line connected to the first-layer wiring line is provided on the main surface of the second inter-layer insulating film, on which the landing pad is provided;

the method comprises the steps of:

forming the cell transistor and the peripheral-circuit transistor respectively in the memory cell area and the peripheral circuit area on the semiconductor substrate;

forming the first inter-layer insulating film on a main surface of the semiconductor substrate;

forming the second inter-layer insulating film on the main surface of the first inter-layer insulating film;

forming the third inter-layer insulating film on the main surface of the second inter-layer insulating film;

forming the second-layer wiring line on the main surface of the third inter-layer insulating film;

forming the capacitor in the third inter-layer insulating film;

forming the landing pad for electrically connecting the capacitor to the cell transistor on the main surface of the second inter-layer insulating film in the memory cell area; and forming the assist wiring line for connecting the first-layer wiring line to the second-layer wiring line on the main surface of the second inter-layer insulating film in the peripheral circuit area; and the step of forming the landing pad and the step of forming the assist wiring line are performed in a single photolithography process.

In a preferable example:

after a preparatory film for forming the third inter-layer insulating film is formed on the second inter-layer insulating film, a deep-hole cylinder is formed through the preparatory film;

after a lower electrode is formed on the inside of the deep-hole cylinder, the preparatory film is removed, and then a capacitance insulating film and an upper electrode are formed;

after the capacitor is formed by patterning, the third inter-layer insulating film is formed so as to cover the capacitor, and then a plug connected to the assist wiring line is formed; and the second-layer wiring line connected to the plug is formed on the third inter-layer insulating film.

In accordance with the semiconductor device and the manufacturing method thereof, the assist wiring line is provided in the peripheral circuit area and at the same layer position as that of the landing pad provided at the bottom surface of the capacitor. Therefore, it is possible to reduce the wiring density with respect to the first-layer wiring line, provide a required flexibility in the circuit layout, and reduce parasitic resistance or parasitic capacitance of the first-layer wiring line. In addition, the semiconductor device can be manufactured without increasing the number of manufacturing processes.

DETAILED DESCRIPTION OF THE INVENTION

Hereinafter, embodiments of the present invention will be described with reference to the appended figures.

First Embodiment

Below, a semiconductor device having a peripheral circuit area of a DRAM cell and the manufacturing method thereof will be explained as a first embodiment of the present invention.

Figure 1:
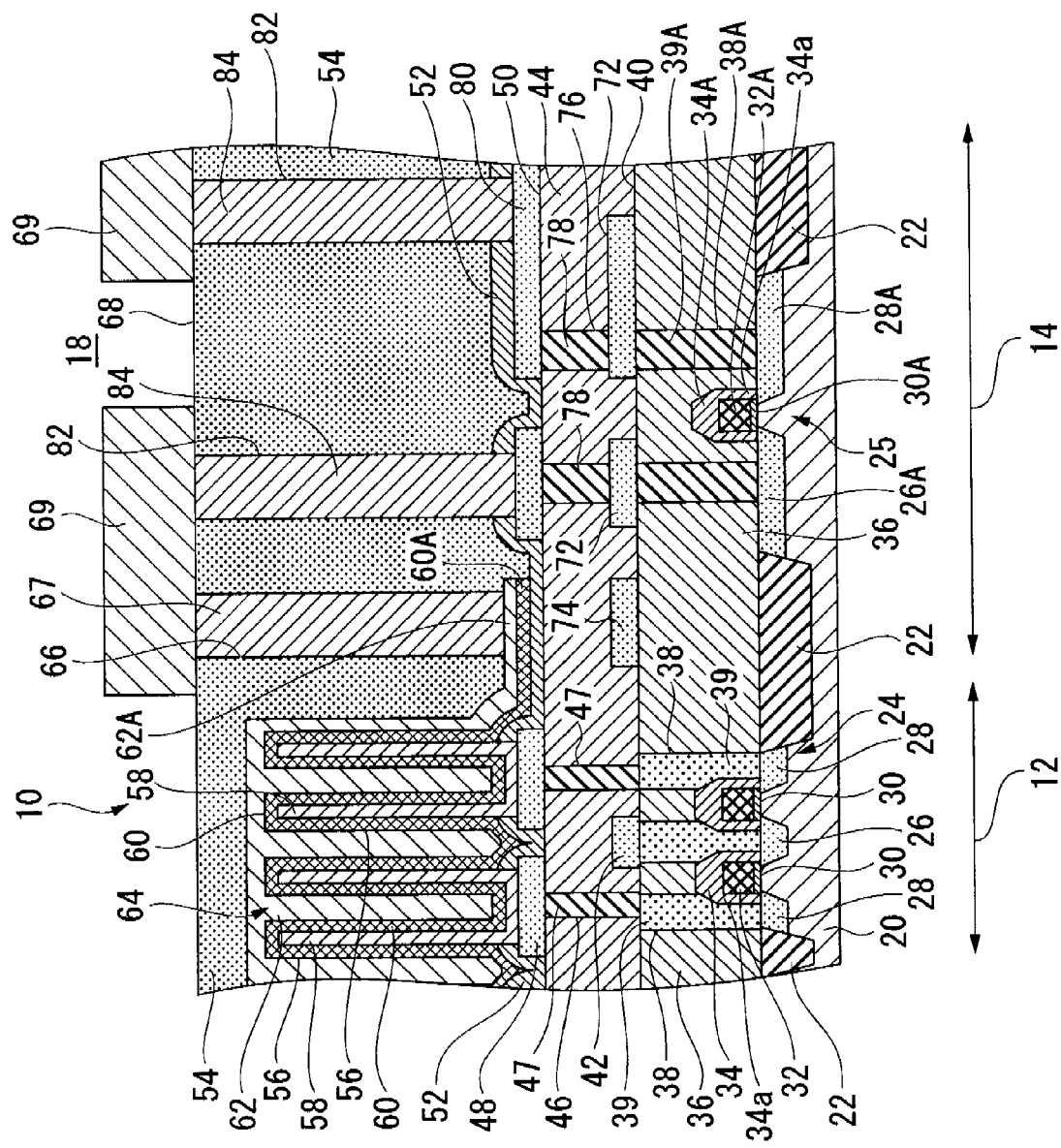
FIG. 1 is a general sectional view showing a semiconductor device as a first embodiment of the present invention.

FIG. 1 is a longitudinal sectional view showing a semiconductor device 10 which includes a memory (cell) area and a peripheral circuit area (or a logic circuit area) of a DRAM cell. That is, in the semiconductor device 10, a memory cell area 12 and a peripheral circuit area 14 of a DRAM cell are provided on a single semiconductor substrate 20.

The memory structure of the DRAM cell will be explained below.

The semiconductor substrate 20 is made of silicon in which p-type impurities are doped. By means of separating insulating areas 22, a transistor forming area of the semiconductor substrate 20 is separated from the other areas in an insulating manner. In an active region interposed between the separating insulating areas 22, diffusion layer areas in which n-type impurities are doped are provided at the center and both sides of the region, that is, the center diffusion layer area 26 and the side diffusion layer areas 28, each of which functions as a source area or a drain area, are formed. A gate insulating film 30 is formed on the semiconductor substrate 20 and between the adjacent diffusion layer areas, and a gate electrode 32 is formed on each gate insulating film 30, thereby forming a cell transistor 24. The cell transistor 24 has a selecting function in the DRAM cell.

In the cell transistor 24, each of the gate insulating films 30 is formed as a silicon oxide film on the semiconductor substrate 20 by means of thermal oxidation. Each of the gate electrodes 32 is formed as a multilayered film of a polysilicon film and a metal film. The polysilicon film may be a doped polysilicon film formed by doping impurities during a film formation by using a CVD method. The metal film may be formed using a refractory metal (i.e., having a high melting point) such as tungsten or tungsten silicide. A silicon nitride film 34 is further formed on each gate electrode 32, and a side-wall insulating film 34a made of a silicon-nitride insulating film is formed on the side wall of the gate electrode 32.

A first inter-layer insulating film 36 is formed on the entire surface of the semiconductor substrate 20 and the insulating films 34, and is made of silicon oxide. In order to individually expose the diffusion layer areas 26 and 28, corresponding first contact holes 38 pass through the first inter-layer insulating film 36, and a polysilicon plug 39 is formed in each first contact hole 38. The polysilicon plug 39 is formed by (i) embedding a polysilicon film, in which n-type impurities are doped, into the corresponding first contact hole 38, (ii) polishing the polysilicon film by means of CMP (chemical mechanical polishing), and (iii) etching back the polysilicon film, so that the polysilicon film remains in the first contact hole 38.

A bit wiring line 42 is formed on the polysilicon plug 39 connected to the diffusion layer area 26, and on a main surface 40 of the first inter-layer insulating film 36. The polysilicon plug 39 connected to each diffusion layer area 28 reaches the upper surface (i.e., the main surface 40) of the first inter-layer insulating film 36. The bit wiring line 42 is made of a metal film of tungsten or the like.

A second inter-layer insulating film 44 is formed on the entire surface of the first inter-layer insulating film 36 and the polysilicon plugs 39. The second inter-layer insulating film 44 may be made of a silicon oxide film which may be formed by means of plasma CVD. Through the second inter-layer insulating film 44, contact holes 46 used for connecting a capacitor are provided. A contact plug 47 made of metal (for connecting a capacitor) is formed in each of the contact holes 46. The contact plug 47 is formed by embedding a tungsten material in the corresponding contact hole 46, (ii) polishing the tungsten material by means of CMP, and (iii) etching back the tungsten material, so that the tungsten material remains in the contact hole 46.

The contact plugs 47 formed through the second inter-layer insulating film 44 are connected via the corresponding polysilicon plugs 38 (passing through the first inter-layer insulating film 36) to the corresponding diffusion layer areas 28. On a main surface 50 (to which the contact plugs 47 are exposed) of the second inter-layer insulating film 44, landing pads 48 made of metal (e.g., titanium) are formed by means of patterning. In addition, a silicon nitride film 52 is formed on the main surface 50 of the second inter-layer insulating film 44 in a manner such that the landing pads 48 formed by the patterning are covered with the silicon nitride film 52.

A silicon oxide film functioning as a third inter-layer insulating film 54 is formed on the entire surface of the silicon nitride film 52, which is formed on the main surface 50 of the second inter-layer insulating film 44. In the third inter-layer insulating film 54 made of the silicon oxide film, each of the landing pads 48 is provided in an area where the silicon nitride film 52 is excluded, and a deep-hole cylinder 56 for forming a capacitor is formed on the landing pad 48. A lower electrode 58, which is made of titanium nitride and has a cup shape, is provided at the inner bottom surface and inner-peripheral surface of each deep-hole cylinder 56. On the surface of the lower electrodes 58, a capacitance insulating film 60, which may be made of hafnium oxide and has a thickness of 8 nm, is formed, and an upper electrode 62, which may be made of titanium nitride and has a thickness of 15 nm, is further formed on the capacitance insulating film 60, thereby forming a capacitor 64 which functions as a capacitive storage part for storing data and may have a height of 2 μm.

Each of the lower electrodes 58 is connected via the corresponding landing pad 48 provided thereunder to the contact plug 47 in the corresponding contact hole 46, and is further electrically connected via the corresponding polysilicon plug 39 (connected to the relevant contact plug 47) to the corresponding diffusion layer area 28 of the relevant transistor.

The upper electrode 62, which may be made of titanium nitride and is formed in the deep-hole cylinder 56, has an extension 62A which extends on the silicon nitride film 52 formed on the main surface 50 of the second inter-layer insulating film 44 above the separating insulating area 22 (of the semiconductor substrate 20) which extends on both the memory cell area 12 and the peripheral circuit area 14. The capacitance insulating film 60 under the upper electrode 62 also has a similar extension 60A.

At the position of the extension 62A of the upper electrode 62 on the main surface 50 of the second inter-layer insulating film 44, a contact hole 66 is provided through the third inter-layer insulating film 54 and is filled with metal so as to form a contact plug 67. The contact plug 67 is connected to a second-layer wiring line 69 which is provided on a main surface 68 of the third inter-layer insulating film 54.

Next, the structure of the peripheral circuit area 14 will be explained. In the peripheral circuit area 14 of the semiconductor substrate 20, a transistor forming area is separated from the other areas in an insulating manner by means of the relevant separating insulating areas 22. In an active region interposed between the separating insulating areas 22, diffusion layer areas 26A and 28A in which n-type impurities are doped are provided at both sides of the region, and each of the diffusion layer areas functions as a source area or a drain area. A gate insulating film 30A is formed on the semiconductor substrate 20 and between the diffusion layer areas 26A and 28A, and a gate electrode 32A is formed on the gate insulating film 30A, thereby forming a transistor 25 in the peripheral circuit area 14.

In the transistor 25 of the peripheral circuit area 14, the gate insulating film 30A is formed as a silicon oxide film on the surface of the semiconductor substrate 20 by means of thermal oxidation. The gate electrode 32A is formed as a multi-layered film of a polysilicon film and a metal film. The polysilicon film may be a doped polysilicon film formed by doping impurities during a film formation by using a CVD method. The metal film may be formed using a refractory metal such as tungsten or tungsten silicide. A separating insulating film 34A made of silicon nitride is formed on the gate electrode 32A, and a side-wall insulating film 34a made of a silicon-nitride insulating film is formed on the side wall of the gate electrode 32A The first inter-layer insulating film 36 is formed on the entire surface of the semiconductor substrate 20 and the separating insulating films 34A, and may be made of a silicon oxide film. In order to expose the diffusion layer areas 26A and 28A, first contact holes 38A pass through the first inter-layer insulating film 36, and a first metal contact plug 39A is formed in each first contact hole 38A. The contact plug 39A is formed by (i) embedding a metal material (e.g., titanium) into the corresponding first contact hole 38A, (ii) polishing the relevant metal film by means of CMP, and (iii) etching back the metal film, so that the metal film remains in the first contact hole 38A.

On the main surface 40 of the first inter-layer insulating film 36, first-layer wiring lines 72 are formed, and they are connected via the first metal contact plugs 39A to the diffusion layer areas 26A and 28A. Another first-layer wiring line 74 is formed on the upper surface (i.e., the main surface 40) of the first inter-layer insulating film 36 and above the separating insulating area 22 (of the semiconductor substrate 20) which extends on both the memory cell area 12 and the peripheral circuit area 14.

The second inter-layer insulating film 44 is formed on the entire surface of the first inter-layer insulating film 36 and the first metal contact plugs 39A. The second inter-layer insulating film 44 may be made of a silicon oxide film which may be formed by means of plasma CVD. In the second inter-layer insulating film 44, second contact holes 76 are provided in a manner such that they pass through the second inter-layer insulating film 44 in the thickness direction thereof. A second metal contact plug 78 is formed in each second contact hole 76. The second metal contact plug 78 is formed by (i) embedding a metal film (e.g., titanium) into the corresponding second contact hole 76, (ii) polishing the metal film by means of CMP, and (iii) etching back the metal film, so that the metal film remains in the second contact hole 76.

The second metal contact plugs 78 formed through the second inter-layer insulating film 44 are connected via the first metal contact plugs 39A (formed through the first inter-layer insulating film 36) to the diffusion layer areas 26A and 28A. On the main surface 50 of the second inter-layer insulating film 44, assist wiring lines 80 are provided by means of patterning, so as to connect each first-layer wiring line 72, which is formed on the main surface 40 of the first inter-layer insulating film 36, to the corresponding second-layer wiring line 69, which is formed on the main surface 68 of the third inter-layer insulating film 54. The assist wiring lines 80 may be made of tungsten. The silicon nitride film 52 is formed on the second inter-layer insulating film 44 so as to cover the assist wiring lines 80 formed by the patterning.

In the third inter-layer insulating film 54 formed on the main surface 50 of the second inter-layer insulating film 44, third contact holes 82 are provided in a manner such that they pass through the third inter-layer insulating film 54 in the thickness direction thereof. A third metal contact plug 84 is formed in each of the third contact holes 82. The third metal contact plug 84 is formed by (i) embedding a metal film (e.g., titanium) into the corresponding third contact hole 82, (ii) polishing the metal film by means of CMP, and (iii) etching back the metal film, so that the metal film remains in the third contact hole 82. The third metal contact plug 84 connects the corresponding second-layer wiring line 69 to the corresponding assist wiring line 80.

In the semiconductor device 10 as described above, the assist wiring lines 80 are provided on the main surface 50 of the second inter-layer insulating film 44 and in the same layer position as that of the landing pads 48. Therefore, a part of the first-layer wiring lines 72 and 74 can be replaced with (a part of) the assist wiring lines 80, or the assist wiring lines 80 can also undertake the function of a part of the first-layer wiring lines 72 and 74, so as to reduce the wiring density with respect to the first-layer wiring lines 72 and 74. In particular, conventionally, high-density wiring is arranged in the area above the separating insulating area 22 which extends on both the memory cell area 12 and the peripheral circuit area 14. When a part of the wiring lines in such an area is replaced with the assist wiring lines 80 or the assist wiring lines 80 also function as a substitute of a part of the first-layer wiring lines 72 and 74, it is possible to reduce the wiring density with respect to the first-layer wiring lines 72 and 74 in the relevant area.

In addition, the first-layer wiring lines 72 and the assist wiring lines 80 are stacked vertically, so that the resistance can be reduced, thereby contributing to a reduction in parasitic resistance or parasitic capacitance of the first-layer wiring lines 72.

Furthermore, as the assist wiring lines 80 are provided at the same layer position as that of the landing pads 48 which are necessarily provided when making the capacitor 64, the assist wiring lines 80 can be formed simultaneously with the formation of the landing pads 48 in a single photolithography process. Therefore, it is unnecessary to provide another photolithography process for forming the assist wiring lines 80. Accordingly, the assist wiring lines 80 can be formed without increasing the number of the manufacturing processes.

Next, the method of manufacturing the semiconductor device in the present embodiment will be explained with reference to FIGS. 2 to 15.

Figure 2:
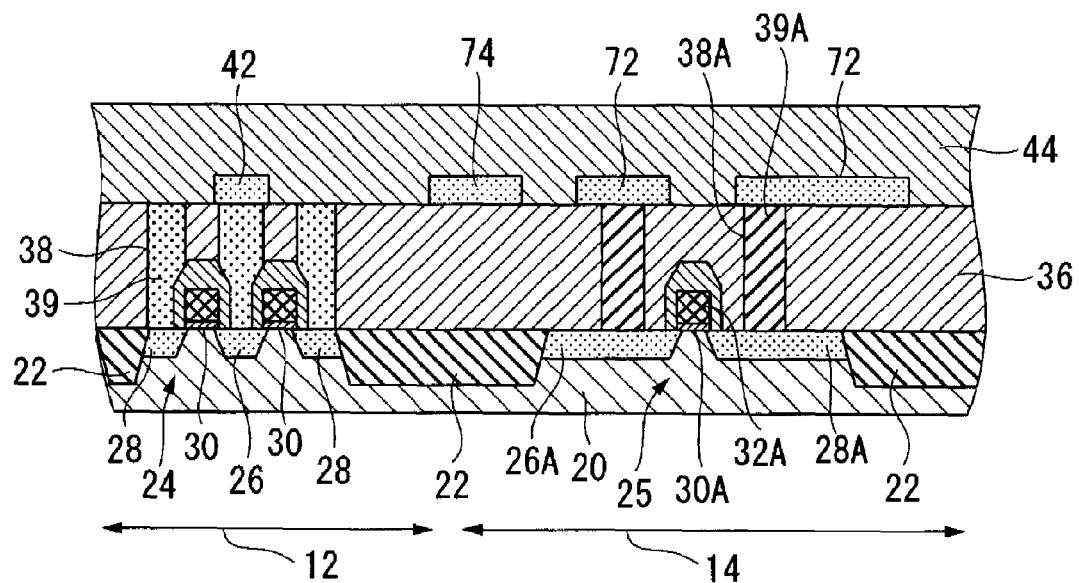
FIG. 2 is a general sectional view for explaining the method of manufacturing the semiconductor device in the first embodiment, and the view shows a state in which a first inter-layer insulating film, first-layer wiring lines, and a second inter-layer insulating film are formed above the transistors which is formed on a semiconductor substrate.

As shown in FIG. 2, the separating insulating areas 22 are formed on the p-type semiconductor substrate 20.

In the transistor forming area (interposed by the relevant separating insulating areas 22) belonging to the cell-transistor area, the transistor 24 is formed, which includes the gate insulating films 30, the gate electrodes 32 made by using a silicon film and a metal (tungsten) film, and the n-type diffusion layer areas 26 and 28, and which is isolated in an insulating manner by means of the separating insulating films 34 and the side-wall insulating films 34a.

In the transistor forming area (interposed by the relevant separating insulating areas 22) belonging to the peripheral circuit area, the transistor 25 is formed, which includes the gate insulating film 30A, the gate electrode 32A made by using a silicon film and a metal (tungsten) film, and the n-type diffusion layer areas 26A and 28A, and which is isolated in an insulating manner by means of the separating insulating film 34A and the side-wall insulating film 34a.

Next, a silicon oxide film as the first inter-layer insulating film 36 is formed on the semiconductor substrate 20 and the transistors 24 and 25 by means of CVD.

After that, in the memory cell area 12 and the peripheral circuit area 14, the first contact holes 38 and 38A are formed through the first inter-layer insulating film 36 by means of photolithography and dry etching by using a photoresist film as the mask, in a manner such that the first contact holes 38 and 38A reach the relevant diffusion layer areas 26, 28, 26A, and 28A on the semiconductor substrate 20. The photoresist film is then detached by means of dry etching.

In the memory cell area 12, a polysilicon material in which impurities such as phosphorus are doped is embedded into the first contact holes 38. Then, only the film on the first inter-layer insulating film 36 is removed by means of an etch-back process (using dry etching) and CMP, thereby forming the polysilicon plugs 39. On the other hand, in the peripheral circuit area 14, a titanium material is embedded into the relevant contact holes, so as to form the first metal contact plugs 39A.

After a tungsten film, which may have a thickness of 11 mm, is formed on the first inter-layer insulating film 36 by means of CVD, the tungsten film is subjected to patterning by means of dry etching, so as to provide a desired circuit form, or the like. The tungsten film functions as the bit wiring line 42 in the memory cell area 12, while it functions as the first-layer wiring lines 72 and 74 in the peripheral circuit area 14. The wiring lines are connected to the corresponding diffusion layer areas 26, 28, 26A, and 28A via the relevant polysilicon plugs 39 and the relevant first metal contact plugs 39A.

Next, the second inter-layer insulating film 44 made of a silicon oxide film is formed on the entire surface of the polysilicon plugs 39 and the main surface 40 of the first inter-layer insulating film 36, where the bit wiring line 42 and the first-layer wiring lines 72 and 74 are formed on the main surface 40.

Figure 3:
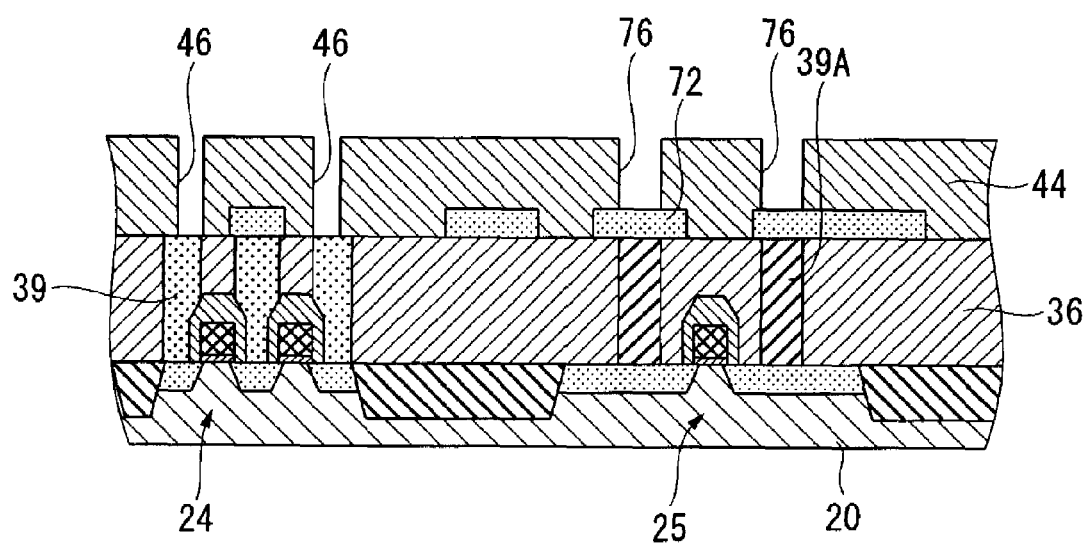
FIG. 3 is also a general sectional view for explaining the manufacturing method, and the view shows a state in which contact holes are formed through the second inter-layer insulating film.

As shown in FIG. 3, in the memory cell area, the contact holes 46 for connecting a capacitor are formed by means of dry etching by using a photoresist film as the mask, in a manner such that they pass through the second inter-layer insulating film 44 and reach the polysilicon plugs 39. The photoresist film is then detached by means of dry etching.

The contact holes 46 are provided for connecting the polysilicon plugs 39 to the deep-hole cylinders 56 (for forming a capacitor) which are formed later.

On the other hand, in the peripheral circuit area 14, the second contact holes 76 are formed in a manner such that they pass through the second inter-layer insulating film 44 and reach the metal contact plugs 39A.

Figure 4:
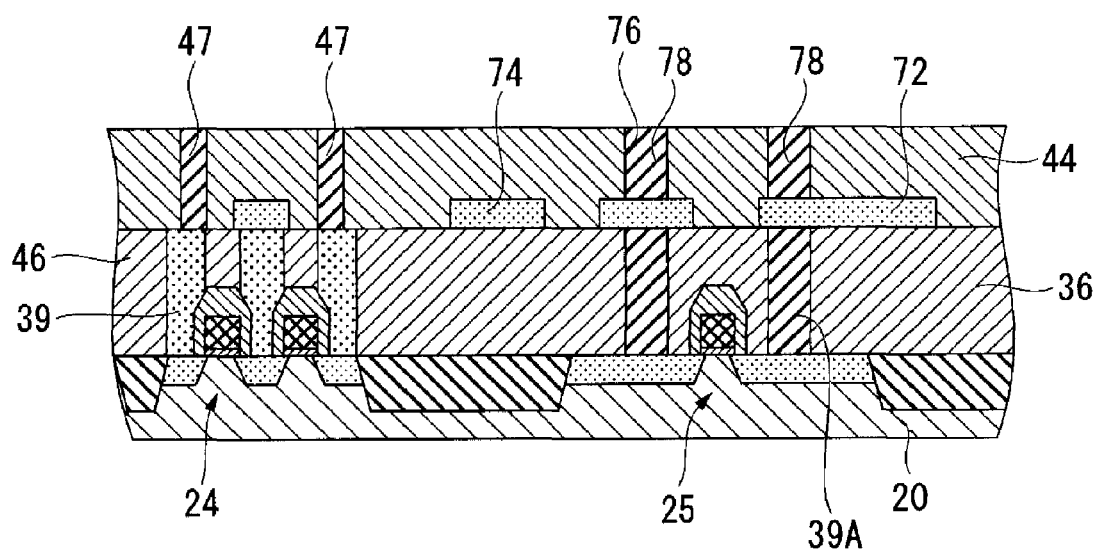
FIG. 4 is also a general sectional view for explaining the manufacturing method, and the view shows a state in which metal contact plugs are formed in the contact holes of FIG. 3.

As shown in FIG. 4, in the contact holes 46 connected to the polysilicon plugs 39 and the second contact holes 76 connected to the first metal contact plugs 39A, the metal contact plugs 47 (for connecting a capacitor) and the second metal contact plugs 78 are respectively formed, and titanium is embedded into each. The titanium metal film outside these contact holes is polished by means of CMP, and then etched back so that the relevant metal remains in each contact hole, thereby forming each metal contact plug.

In the memory cell area 12, as the titanium film can react to silicon on the head of each polysilicon plug 39 by means of thermal processing, the conductive resistance between each metal contact plug 47 and the corresponding polysilicon plug 39 can be reduced.

Figure 5:
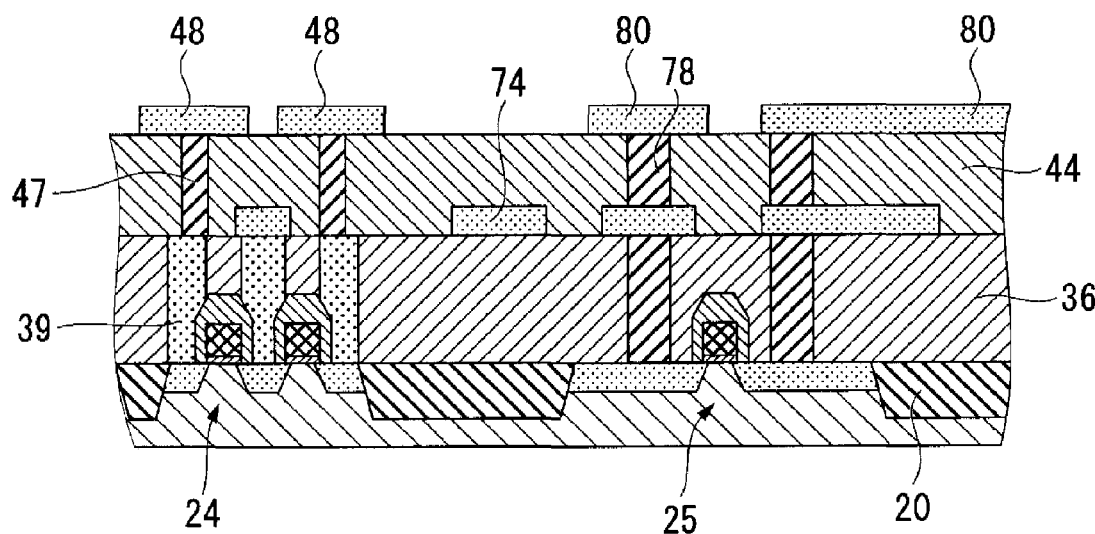
FIG. 5 is also a general sectional view for explaining the manufacturing method, and the view shows a state in which second-layer wiring lines are formed on the second inter-layer insulating film.

As shown in FIG. 5, a tungsten nitride film and a tungsten film are stacked on the main surface of the second inter-layer insulating film 44 by means of sputtering, and then patterning is performed by means of photolithography and dry etching, thereby forming the landing pads 48 in the memory cell area 12 and the assist wiring lines 80 in the peripheral circuit area 14.

As described above, in this process, the assist wiring lines 80 are formed at the same layer position as that of the landing pads 48. Therefore, in a single photolithography process, the landing pads 48 and the assist wiring lines 80 can be formed simultaneously. Accordingly, the assist wiring lines 80 can be formed without adding another photolithography process for forming them, that is, without increasing the number of the manufacturing processes.

Figure 6:
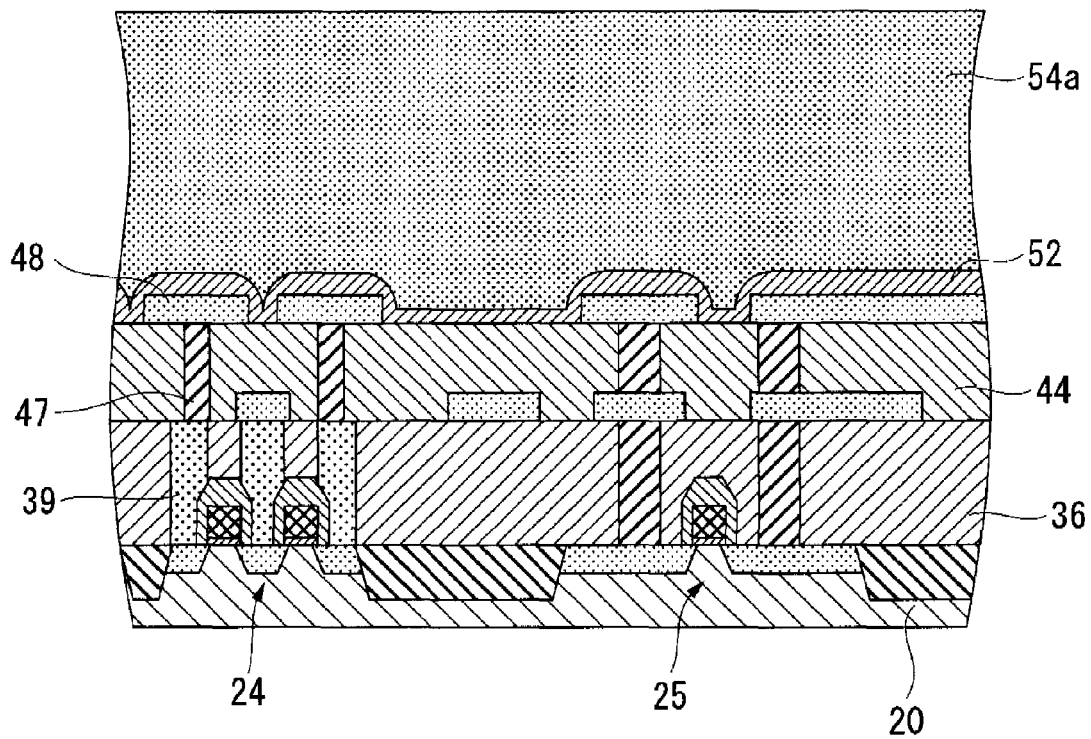
FIG. 6 is also a general sectional view for explaining the manufacturing method, and the view shows a state in which a silicon nitride film and a third inter-layer insulating film are formed on the second-layer wiring lines.

As shown in FIG. 6, the silicon nitride film 52 is deposited so as to cover the landing pads 48 and the assist wiring lines 80, and a silicon oxide film which has a thickness of 3 μm and functions as a preparatory film 54a for the third inter-layer insulating film is further deposited on the silicon nitride film 52.

Figure 7:
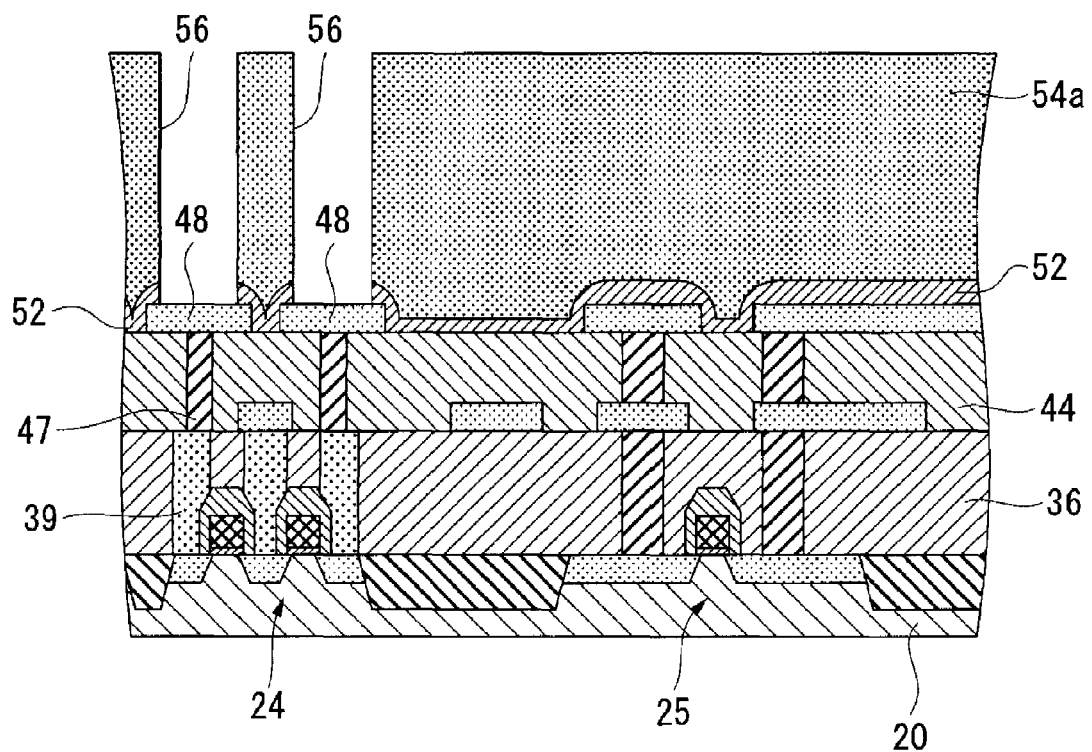
FIG. 7 is also a general sectional view for explaining the manufacturing method, and the view shows a state in which deep-hole cylinders are formed through the third inter-layer insulating film.

As shown in FIG. 7, in the memory cell area 12, the deep-hole cylinders 56 (for forming a capacitor), which pass through the preparatory film 54a and the silicon nitride film 52, are formed by means of photolithography and dry etching, so that the surface of each landing pad 48 is exposed at the bottom-surface position of the corresponding deep-hole cylinder 56.

Figure 8:
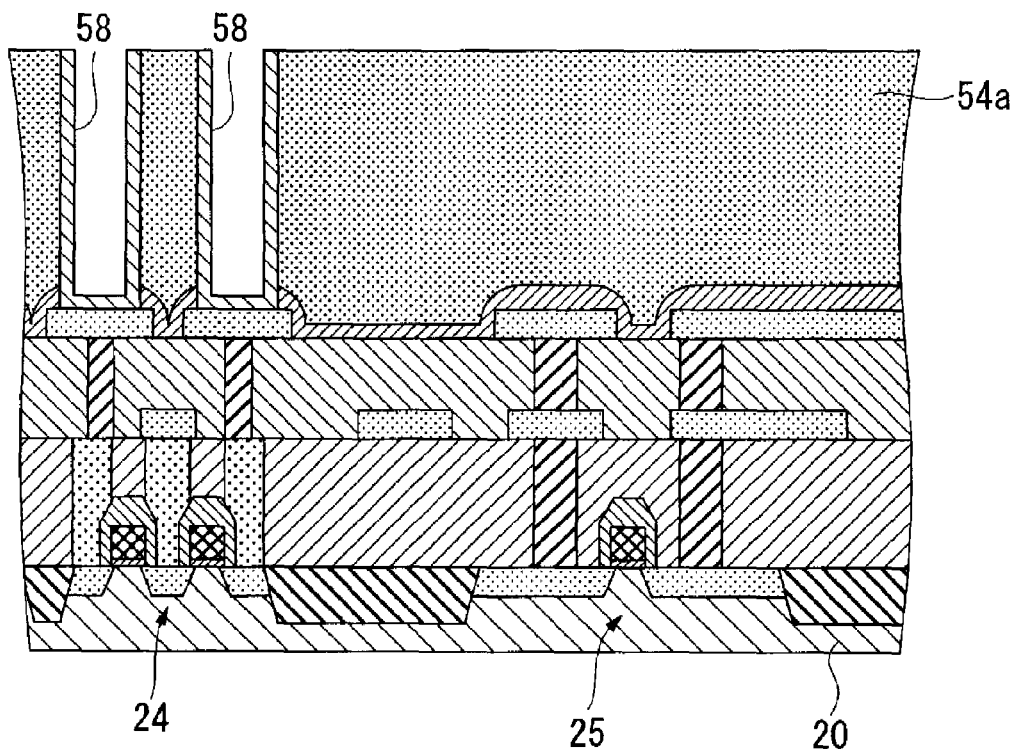
FIG. 8 is also a general sectional view for explaining the manufacturing method, and the view shows a state in which lower electrodes are formed in the deep-hole cylinders.

As shown in FIG. 8, the capacitor 64 (for the relevant memory) is formed using the deep-hole cylinders 56.

First, as each of the first electrodes 58, a first titanium nitride film having a thickness of 15 nm is deposited by means of CVD. Such a CVD growth of the titanium nitride film may be performed by using titanium tetrachloride (TiCl$_4$) and ammonia (NH$_3$) as source gases, and at a wafer temperature of 600° C. in a sheet-type film formation apparatus. In the next step, a photoresist film is formed in each cylinder so as to prevent the titanium nitride film at the bottom of the cylinder from being etched, while the titanium nitride film above the cylinder is etched back and removed. The photoresist film is then detached using an organic release agent, thereby forming the lower electrode 58 having a cup shape.

Figure 9:
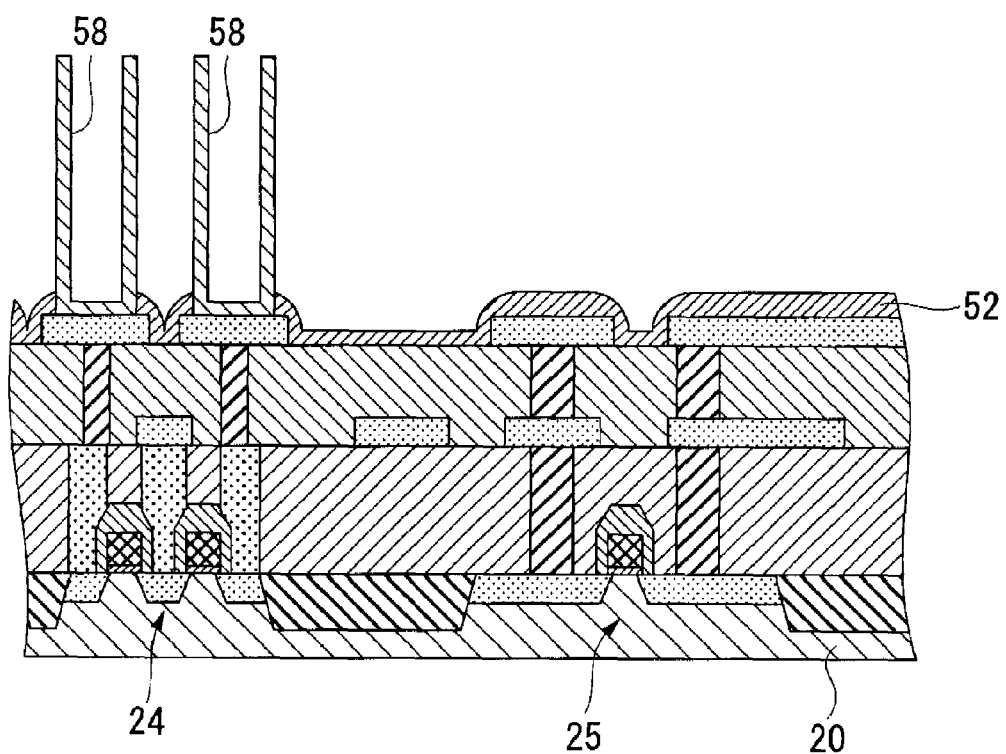
FIG. 9 is also a general sectional view for explaining the manufacturing method, and the view shows a state in which the third inter-layer insulating film is removed.

As shown in FIG. 9, the silicon oxide film as the preparatory film 54a for the third inter-layer insulating film is removed by means of wet etching which uses a dilute hydrofluoric acid solution (HF), where the silicon nitride film 52 functions as the etching stopper.

Figure 10:
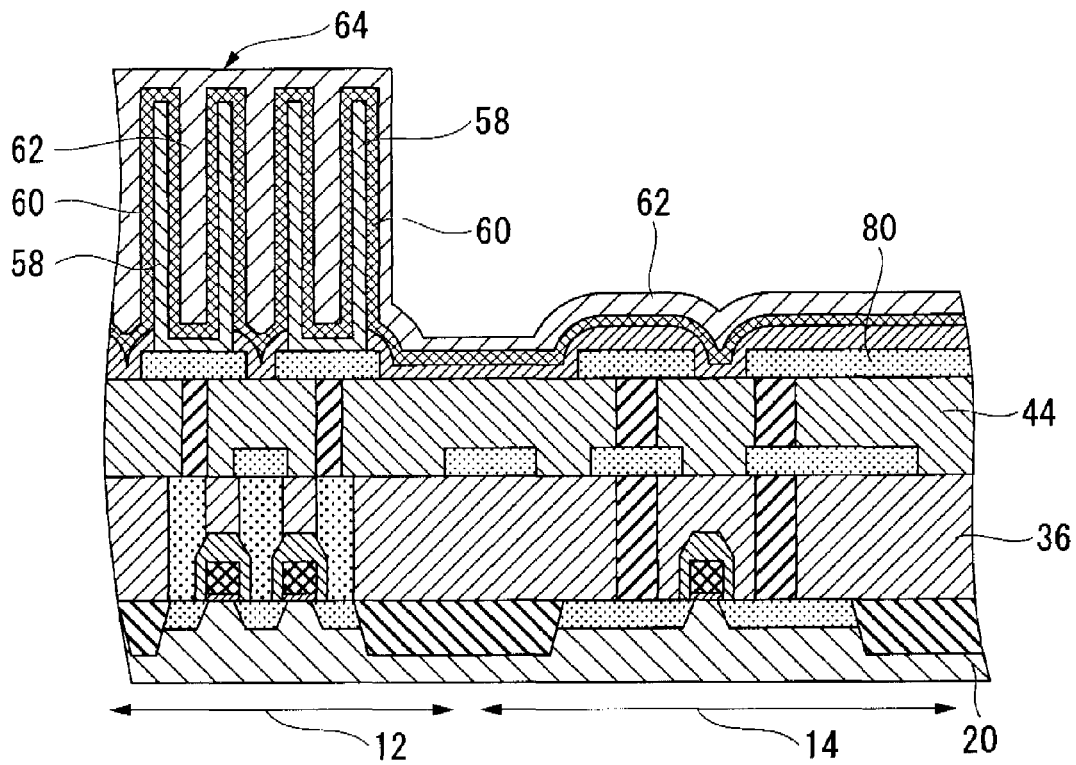
FIG. 10 is also a general sectional view for explaining the manufacturing method, and the view shows a state in which a capacitance insulating film and a film for an upper electrode are stacked on the lower electrodes.

As shown in FIG. 10, the capacitance insulating film 60 is formed so as to cover the lower electrodes 58. In the first step, a hafnium oxide film having a thickness of 8 nm is formed by means of ALD (atomic layer deposition). Such an ALD growth of the hafnium oxide film may be performed by using tetrakis-ethyl-methyl-amino-hafnium ([CH$_3$CH$_2$(CH$_3$)N]$_4$.Hf) and ozone (O$_3$) as source gases, and at a wafer temperature of 350° C. in a sheet-type film formation apparatus. In the next step, a first titanium nitride film having a thickness of 20 nm for forming the upper electrode 62 is formed by means of CVD. The capacitance insulating film 60 and the upper electrode 62 are formed on the silicon nitride film 52.

The CVD growth of the relevant titanium nitride film may be performed at a wafer temperature of 500° C., by means of an SFD (sequential flow deposition) method in which a step of supplying titanium tetrachloride and ammonia simultaneously as source gases and a step of supplying only ammonia are alternately repeated.

In the next step, the titanium nitride film and the hafnium oxide film are processed to provide the form of the upper electrode, by means of photolithography and dry etching, thereby forming the capacitor 64 which has a cylindrical form and a height of 2 μm.

Figure 11:
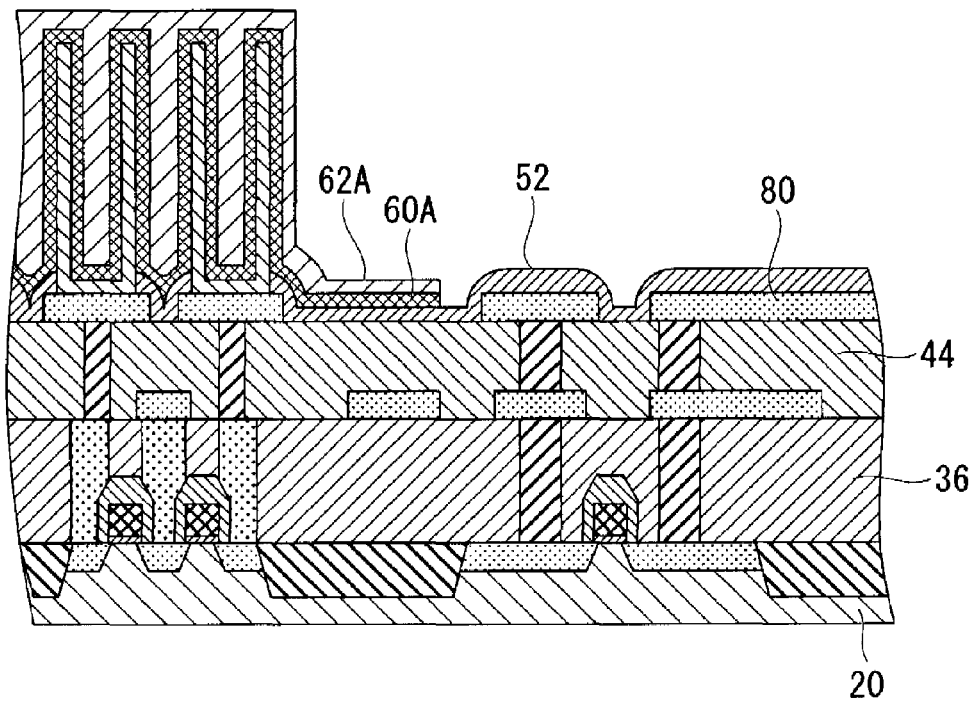
FIG. 11 is also a general sectional view for explaining the manufacturing method, and the view shows a state in which a capacitor structure is formed by removing a part (belonging to the peripheral circuit area) of the capacitance insulating film and the film for the upper electrode.

On the other hand, as shown in FIG. 11, in the peripheral circuit area 14, the hafnium oxide film for forming the capacitance insulating film 60 and the titanium nitride film for forming the upper electrode 62 are removed.

Figure 12:
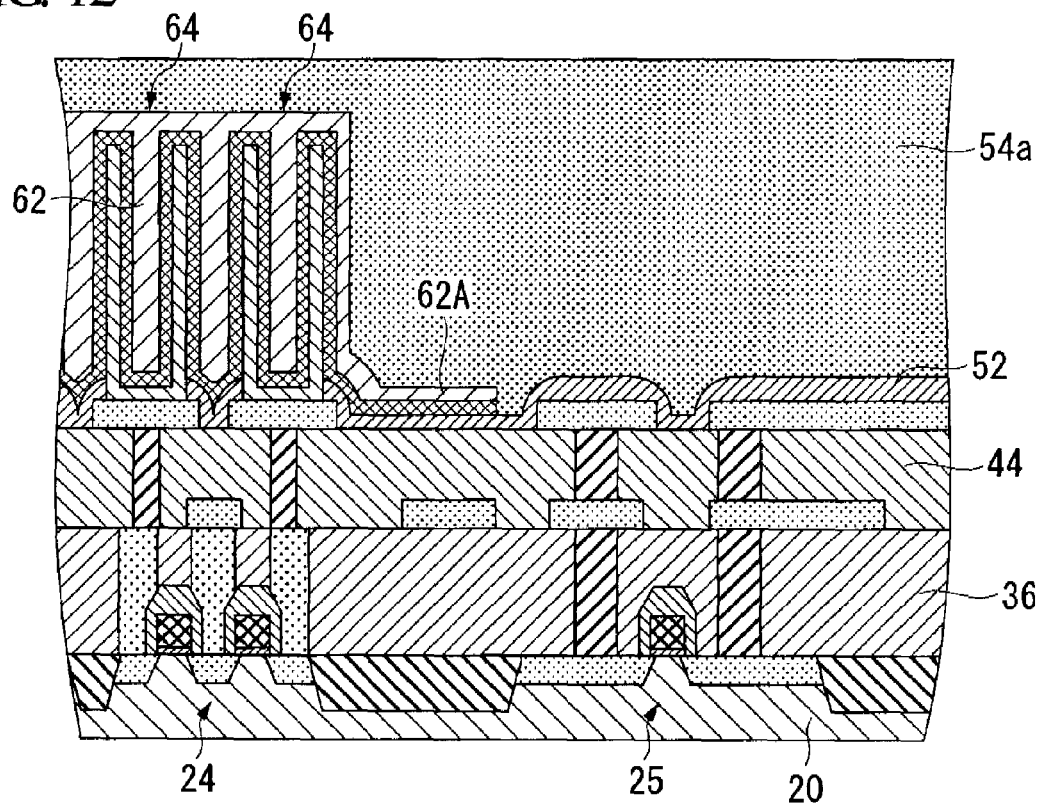
FIG. 12 is also a general sectional view for explaining the manufacturing method, and the view shows a state in which the third inter-layer insulating film is again formed after forming the capacitor structure.

As shown in FIG. 12, a silicon oxide film as the third inter-layer insulating film 54 is again deposited on the upper electrode 62 of the capacitor 64 and the exposed silicon nitride film 52, so as to remove the step formed between the memory cell area 12 and the peripheral circuit area 14 and thus to form a flat surface by means of CMP.

Figure 13:
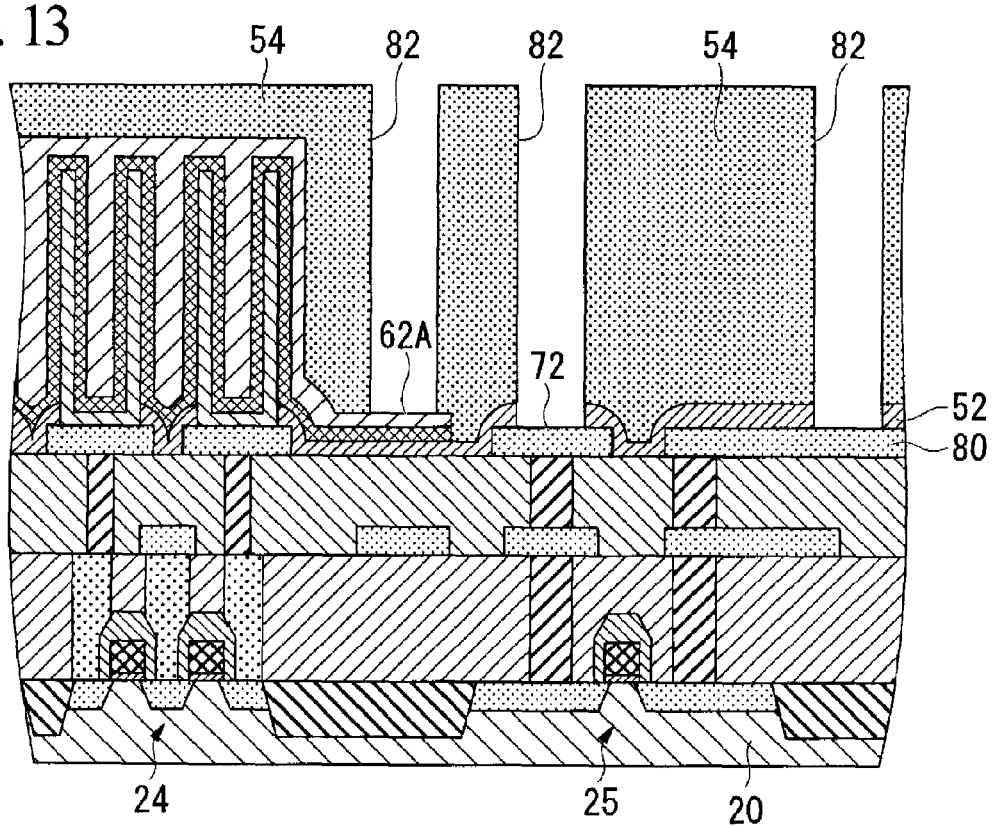
FIG. 13 is also a general sectional view for explaining the manufacturing method, and the view shows a state in which contact holes are formed through the third inter-layer insulating film.

As shown in FIG. 13, the third contact holes 82 are provided through the third inter-layer insulating film 54. The third contact hole 82 which is formed at the boundary between the memory cell area 12 and the peripheral circuit area 14 reaches the upper surface of the extension 62A on a side of the capacitor 64. On the other hand, in the peripheral circuit area 14, the third contact holes 82 pass through the silicon nitride film 52 and reach the assist wiring lines 80 under the silicon nitride film 52.

Figure 14:
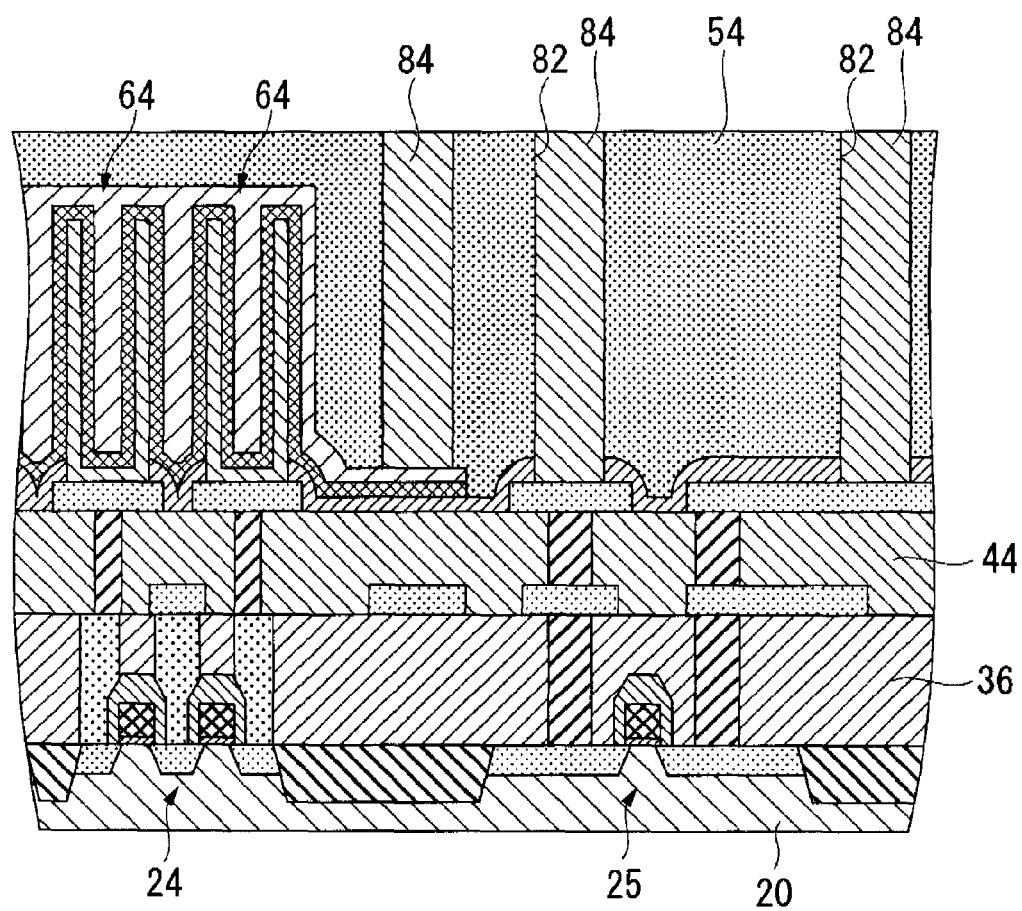
FIG. 14 is also a general sectional view for explaining the manufacturing method, and the view shows a state in which contact plugs are formed in the contact holes formed through the third inter-layer insulating film.

As shown in FIG. 14, a titanium nitride film and a tungsten film are embedded into each third contact hole 82 (formed through the third inter-layer insulating film 54), and the titanium nitride film outside the contact holes 82 is removed by means of CMP, thereby forming the third metal contact plug 84 in each contact hole 82.

After that, a titanium film, an aluminium film, and a titanium nitride film are formed in this order on the main surface of the third inter-layer insulating film 54 by means of sputtering, and this multilayered film is subjected to patterning by means of photolithography and dry etching, thereby forming the second-layer wiring lines 69. Accordingly, the semiconductor device 10 having the structure as shown in FIG. 1 is provided.

Second Embodiment

Figure 15:
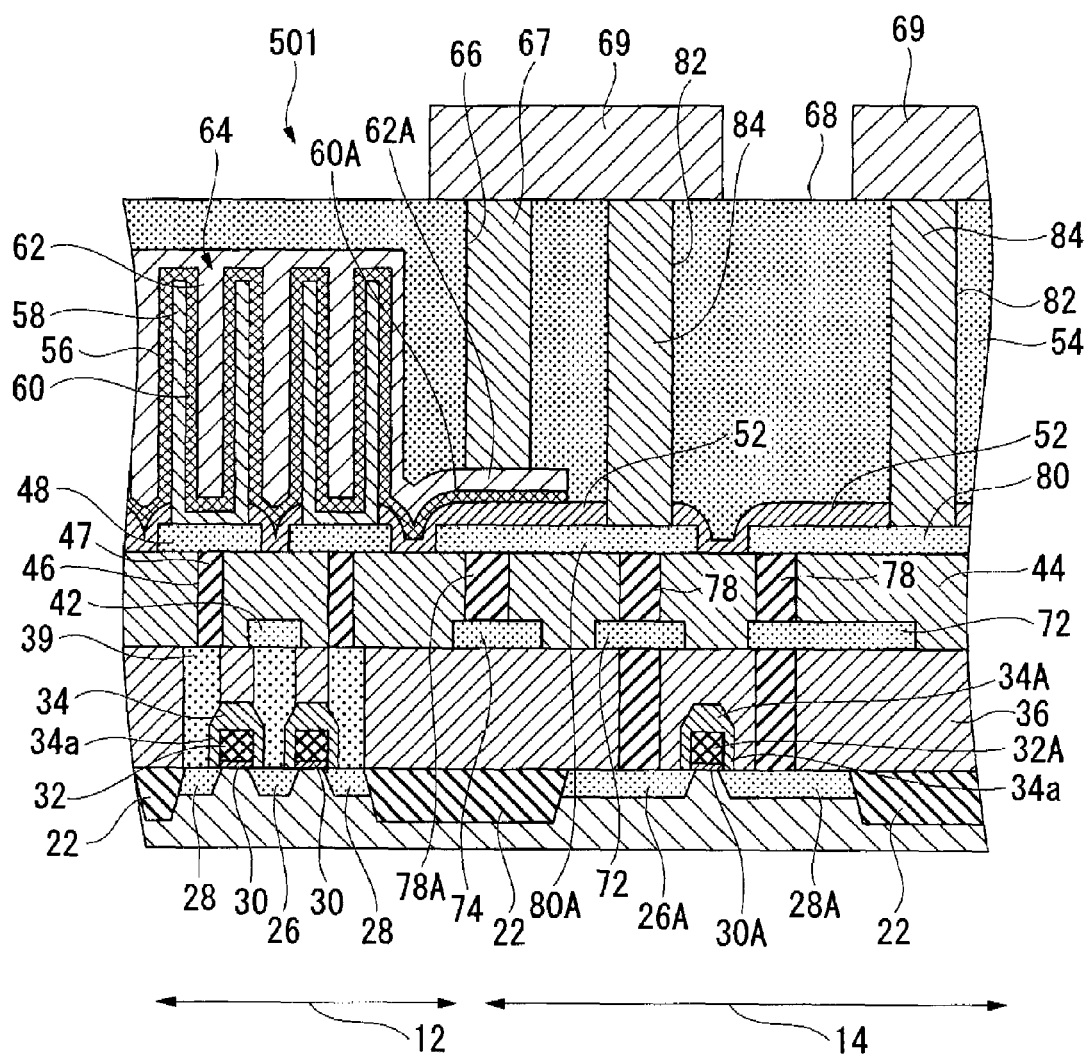
FIG. 15 is a general sectional view showing a semiconductor device as a second embodiment of the present invention.
Figure 16:
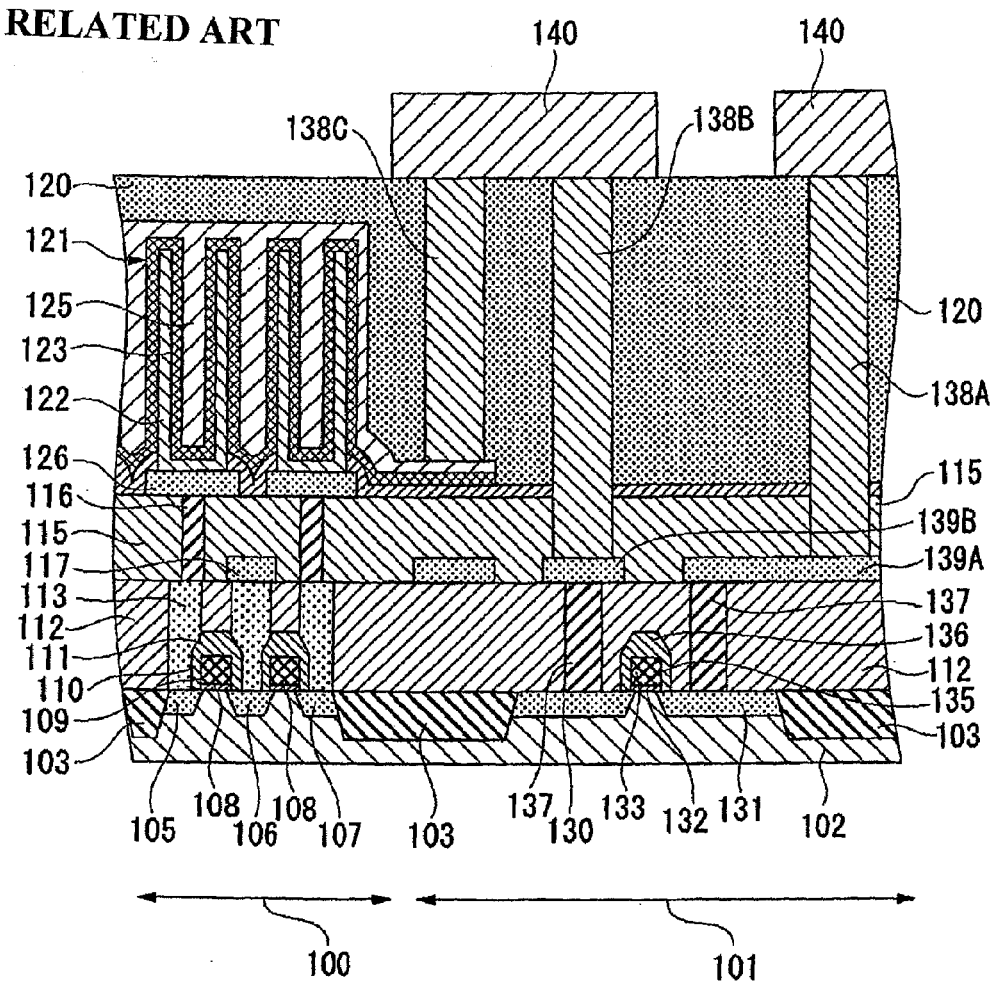
FIG. 16 is a general sectional view of a semiconductor device, which the inventors of the present invention have developed and studied.

FIG. 15 is a general sectional view showing a semiconductor device 501 as a second embodiment of the present invention. In comparison with the first embodiment, the semiconductor device 501 of the present embodiment has a distinctive extension structure of the upper electrode 62 on a side of the capacitor 64. The other parts are identical to those in the first embodiment, and explanations thereof are omitted.

As shown in FIG. 15, in the semiconductor device 501 of the second embodiment, an assist wiring line 80A is formed by means of patterning on the main surface 50 of the second inter-layer insulating film 44, in a manner such that it extends to the boundary between the memory cell area 12 and the peripheral circuit area 14. The upper electrode 62 with respect to the deep-hole cylinders 56 for forming the capacitor 64 extends on the silicon nitride film 52 which covers the assist wiring line 80A. The assist wiring line 80A is connected (i) via a second metal contact plug 78A to the first-layer wiring line 74 which is formed by means of patterning on the main surface 40 of the first inter-layer insulating film 36, and (ii) via the corresponding contact plug 84, which is formed through third inter-layer insulating film 54, to the corresponding second-layer wiring line 69 on the third inter-layer insulating film 54.

In the semiconductor device 501 of the second embodiment, in the boundary area (above the relevant separating insulating area 22) between the memory cell area 12 and the peripheral circuit area 14, that is, the area having a relatively high wiring density, the assist wiring line 80A is provided so as to efficiently arrange the wiring line in the above boundary area which is not positively used in conventional devices. Therefore, it is possible to reduce the wiring density with respect to the first-layer wiring lines 72 and 74. In addition, as the assist wiring line 80A is provided at the same layer position as that of the landing pads 48, it can be formed without adding any specific processes, which is similar to the assist wiring lines 80 in the first embodiment.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

The present invention can be widely applied to a DRAM or a semiconductor device such as a DRAM which includes a logic circuit and a peripheral circuit, and an integrated circuit such as an embedded LSI or a system LSI, which includes a DRAM.

What is claimed is:

1. A semiconductor device having a memory cell area for storing data and a peripheral circuit area adjacent thereto on a semiconductor substrate, wherein:
   in the memory cell area, a cell transistor, a bit wiring line connected to the cell transistor, and a capacitor also connected to the cell transistor are provided in a vertically-layered structure;
   a first inter-layer insulating film is provided so as to cover the cell transistor;
   a second inter-layer insulating film is provided so as to cover the bit wiring line which is provided in an upper layer with respect to that of the cell transistor;
   a third inter-layer insulating film is provided so as to cover the capacitor which is provided in an upper layer with respect to that of the bit wiring line;
   in the peripheral circuit area, a peripheral-circuit transistor is provided and is covered with the first inter-layer insulating film;
   a first-layer wiring line connected to the peripheral-circuit transistor is provided on a main surface of the first inter-layer insulating film;
   the first-layer wiring line is covered with the second inter-layer insulating film;
   a second-layer wiring line is provided on a main surface of the third inter-layer insulating film which is formed on the second inter-layer insulating film;
   in the memory cell area, a landing pad is provided on a main surface of the second inter-layer insulating film and at a connection part between the capacitor and a contact plug which is formed for connecting the capacitor to the cell transistor provided in a lower layer; and
   an assist wiring line connected to the first-layer wiring line is provided on the main surface of the second inter-layer insulating film, on which the landing pad is provided.

2. The semiconductor device in accordance with claim 1, wherein the assist wiring line is connected to both the first-layer wiring line and the second-layer wiring line.

3. The semiconductor device in accordance with claim 1, wherein:
   the capacitor has a stacked structure including a lower electrode, a capacitance insulating film, and an upper electrode; and
   the landing pad is provided between the lower electrode and the contact plug.

4. The semiconductor device in accordance with claim 1, wherein the assist wiring line provided on the main surface of the second inter-layer insulating film is arranged to extend on both the memory cell area and the peripheral circuit area on the semiconductor substrate.

5. The semiconductor device in accordance with claim 1, wherein the assist wiring line provided on the main surface of the second inter-layer insulating film is electrically connected to the first-layer wiring line which is formed on the main surface of the first inter-layer insulating film and is positioned above a separating insulating film by which the memory cell area and the peripheral circuit area are separated from each other on the semiconductor substrate.

6. A method of manufacturing a semiconductor device having a memory cell area for storing data and a peripheral circuit area adjacent thereto on a semiconductor substrate, wherein:
   in the memory cell area, a cell transistor, a bit wiring line connected to the cell transistor, and a capacitor also connected to the cell transistor are provided in a vertically-layered structure;
   a first inter-layer insulating film is provided so as to cover the cell transistor;
   a second inter-layer insulating film is provided so as to cover the bit wiring line which is provided in an upper layer with respect to that of the cell transistor;
   a third inter-layer insulating film is provided so as to cover the capacitor which is provided in an upper layer with respect to that of the bit wiring line;

in the peripheral circuit area, a peripheral-circuit transistor is provided and is covered with the first inter-layer insulating film;

a first-layer wiring line connected to the peripheral-circuit transistor is provided on a main surface of the first inter-layer insulating film;

the first-layer wiring line is covered with the second inter-layer insulating film;

a second-layer wiring line is provided on a main surface of the third inter-layer insulating film which is formed on the second inter-layer insulating film;

in the memory cell area, a landing pad is provided on a main surface of the second inter-layer insulating film and at a connection part between the capacitor and a contact plug which is formed for connecting the capacitor to the cell transistor provided in a lower layer;

an assist wiring line connected to the first-layer wiring line is provided on the main surface of the second inter-layer insulating film, on which the landing pad is provided;

the method comprises the steps of:

forming the cell transistor and the peripheral-circuit transistor respectively in the memory cell area and the peripheral circuit area on the semiconductor substrate;

forming the first inter-layer insulating film on a main surface of the semiconductor substrate;

forming the second inter-layer insulating film on the main surface of the first inter-layer insulating film;

forming the third inter-layer insulating film on the main surface of the second inter-layer insulating film;

forming the second-layer wiring line on the main surface of the third inter-layer insulating film;

forming the capacitor in the third inter-layer insulating film;

forming the landing pad for electrically connecting the capacitor to the cell transistor on the main surface of the second inter-layer insulating film in the memory cell area; and forming the assist wiring line for connecting the first-layer wiring line to the second-layer wiring line on the main surface of the second inter-layer insulating film in the peripheral circuit area; and the step of forming the landing pad and the step of forming the assist wiring line are performed in a single photolithography process.

7. The method in accordance with claim 6, wherein:

after a preparatory film for forming the third inter-layer insulating film is formed on the second inter-layer insulating film, a deep-hole cylinder is formed through the preparatory film;

after a lower electrode is formed on the inside of the deep-hole cylinder, the preparatory film is removed, and then a capacitance insulating film and an upper electrode are formed;

after the capacitor is formed by patterning, the third inter-layer insulating film is formed so as to cover the capacitor, and then a plug connected to the assist wiring line is formed; and the second-layer wiring line connected to the plug is formed on the third inter-layer insulating film.

* * * * *